United States Patent
Bui et al.

(10) Patent No.: US 8,399,909 B2
(45) Date of Patent: Mar. 19, 2013

(54) TETRA-LATERAL POSITION SENSING DETECTOR

(75) Inventors: Peter Steven Bui, Cerritos, CA (US); Narayan Dass Taneja, Long Beach, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 281 days.

(21) Appl. No.: 12/774,958

(22) Filed: May 6, 2010

(65) Prior Publication Data

US 2010/0308371 A1    Dec. 9, 2010

Related U.S. Application Data

(60) Provisional application No. 61/177,329, filed on May 12, 2009.

(51) Int. Cl.
*H01L 31/102* (2006.01)

(52) U.S. Cl. .............. 257/184; 257/94; 257/99; 257/81; 257/101; 257/463; 438/47

(58) Field of Classification Search .................... 257/79, 257/80, 81, 82, 84, 83, 85, 86, 90, 94, 99, 257/461, 464, 431, 436, 437, E31.099, 13, 257/22, 98, 101, 102, 103, 463, 432, 433, 257/434, 183, 184, 21; 438/28, 81, 116, 438/FOR. 157, FOR. 416, 48, 29, 22, 27, 438/46, 47

See application file for complete search history.

(56) References Cited

U.S. PATENT DOCUMENTS

| | | | |
|---|---|---|---|
| 3,041,226 A | 6/1962 | Pennington | |
| 3,713,921 A | 1/1973 | Fleischer et al. | |
| 3,765,969 A | 10/1973 | Kragness et al. | |
| 3,801,390 A | 4/1974 | Lepselter et al. | |
| 3,808,068 A | 4/1974 | Johnson et al. | |
| 3,887,936 A | 6/1975 | Shannon et al. | |
| 4,210,923 A | 7/1980 | North et al. | |

(Continued)

FOREIGN PATENT DOCUMENTS

| EP | 0 347 157 | 12/1989 |
|---|---|---|
| EP | 0436282 | 7/1991 |

(Continued)

OTHER PUBLICATIONS

Y. Atatsu, Y. Muramoto, K. Kato, M. Ikeda, M. Ueki, A. Kozen, T. Kurosaki, K. Kawano, and J. Yoshida, "Long-wavelength multimode waveguide photodiodes suitable for hybrid optical module integrated with planar lightwave circuit", Electron. Lett., vol. 31, pp. 2098-2100, 1995.

(Continued)

*Primary Examiner* — Ha Tran T Nguyen
*Assistant Examiner* — Thanh Y Tran
(74) *Attorney, Agent, or Firm* — Novel IP

(57) ABSTRACT

The present invention is directed to a position sensing detector made of a photodiode having a semi insulating substrate layer; a buffered layer that is formed directly atop the semi-insulating substrate layer, an absorption layer that is formed directly atop the buffered layer substrate layer, a cap layer that is formed directly atop the absorption layer, a plurality of cathode electrodes electrically coupled to the buffered layer or directly to the cap layer, and at least one anode electrode electrically coupled to a p-type region in the cap layer. The position sensing detector has a photo-response non-uniformity of less than 2% and a position detection error of less than 10 μm across the active area.

14 Claims, 24 Drawing Sheets

U.S. PATENT DOCUMENTS

| | | |
|---|---|---|
| 4,290,844 A | 9/1981 | Rotolante et al. |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,049,962 A | 9/1991 | Huang et al. |
| 5,053,318 A | 10/1991 | Gulla et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,254,480 A | 10/1993 | Tran |
| 5,276,955 A | 1/1994 | Noddin et al. |
| 5,408,122 A | 4/1995 | Reele |
| 5,430,321 A | 7/1995 | Effelsberg |
| 5,446,308 A | 8/1995 | Piccone et al. |
| 5,446,751 A | 8/1995 | Wake |
| 5,501,990 A | 3/1996 | Holm et al. |
| 5,576,559 A | 11/1996 | Davis |
| 5,599,389 A | 2/1997 | Iwasaki |
| 5,656,508 A | 8/1997 | So et al. |
| 5,818,096 A | 10/1998 | Ishibashi et al. |
| 5,825,047 A | 10/1998 | Ajisawa et al. |
| 5,869,834 A | 2/1999 | Wipenmyr |
| 5,889,313 A | 3/1999 | Parker |
| 5,923,720 A | 7/1999 | Barton et al. |
| 5,928,438 A | 7/1999 | Salami et al. |
| 6,027,956 A | 2/2000 | Irissou |
| 6,175,141 B1 | 1/2001 | Hofbauer et al. |
| 6,218,684 B1 | 4/2001 | Kuhara et al. |
| 6,326,300 B1 | 12/2001 | Liu et al. |
| 6,326,649 B1 | 12/2001 | Chang et al. |
| 6,352,517 B1 | 3/2002 | Flock et al. |
| 6,426,991 B1 | 7/2002 | Mattson et al. |
| 6,438,296 B1 | 8/2002 | Kongable |
| 6,489,635 B1 | 12/2002 | Sugg |
| 6,504,158 B2 | 1/2003 | Possin |
| 6,510,195 B1 | 1/2003 | Chappo et al. |
| 6,546,171 B2 | 4/2003 | Fukutomi |
| 6,569,700 B2 | 5/2003 | Yang |
| 6,593,636 B1 | 7/2003 | Bui et al. |
| 6,670,258 B2 | 12/2003 | Carlson et al. |
| 6,734,416 B2 | 5/2004 | Carlson et al. |
| 6,772,729 B2 | 8/2004 | Brosseau et al. |
| 6,815,790 B2 | 11/2004 | Bui et al. |
| 6,826,080 B2 | 11/2004 | Park et al. |
| 7,057,254 B2 | 6/2006 | Bui et al. |
| 7,057,255 B2 * | 6/2006 | Yamabayashi et al. ....... 257/461 |
| 7,112,465 B2 | 9/2006 | Goushcha et al. |
| 7,198,972 B2 | 4/2007 | Sato |
| 7,242,069 B2 | 7/2007 | Bui et al. |
| 7,279,731 B1 | 10/2007 | Bui et al. |
| 2001/0034105 A1 | 10/2001 | Carlson |
| 2002/0056845 A1 | 5/2002 | Iguchi et al. |
| 2004/0104351 A1 | 6/2004 | Shibayama |
| 2004/0206886 A1 | 10/2004 | Carlson et al. |
| 2004/0222358 A1 | 11/2004 | Bui et al. |
| 2004/0241897 A1 | 12/2004 | Rhee et al. |
| 2004/0262652 A1 | 12/2004 | Goushcha et al. |
| 2005/0186754 A1 | 8/2005 | Kim |
| 2006/0220078 A1 | 10/2006 | Bui et al. |
| 2006/0255420 A1 | 11/2006 | Bui et al. |
| 2006/0278898 A1 | 12/2006 | Shibayama |
| 2007/0001254 A1 * | 1/2007 | Inada ............................. 257/461 |
| 2007/0090394 A1 | 4/2007 | Bui et al. |
| 2007/0096178 A1 * | 5/2007 | Iguchi ........................... 257/292 |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0099871 A1 | 5/2008 | Bui et al. |
| 2008/0128846 A1 | 6/2008 | Bui et al. |
| 2008/0277753 A1 | 11/2008 | Bui et al. |

FOREIGN PATENT DOCUMENTS

| | | |
|---|---|---|
| EP | 0 723 301 A2 | 5/1997 |
| EP | 1 069 626 A2 | 1/2001 |
| EP | 1 205 983 A1 | 5/2002 |
| WO | WO/00/52766 | 9/2000 |

OTHER PUBLICATIONS

Fukano et al., "High-REsponsivity and Low-Operation-Voltage Edge-Illuminated Refracting-Facet Photodiodes with Large Alignment Tolerance for Single-Mode Fiber", Journal of Lightwave Technology, vol. 16, No. 5, May 1997.

* cited by examiner

TETRA-LATERAL POSITION SENSING DETECTOR

CROSS-REFERENCE TO RELATED APPLICATIONS

The present application relies on U.S. Provisional Application No. 61/177,329, filed on May 12, 2009. In addition, the present application is related to U.S. Pat. No. 6,815,790, which is herein incorporated by reference in its entirety.

FIELD OF THE INVENTION

The present invention relates generally to the field of position sensing detectors, and more specifically, to a tetra-lateral semiconductor based position-sensing photodiode, having improved photo response non-uniformity.

BACKGROUND OF THE INVENTION

The demand for precise detection of the position of incident light is crucial for a variety of applications, such as automatic focusing, position-sensing, movement monitoring, mirror alignment, distortion and vibration measurements, and for use within photocopy machines, facsimile machines, automatic lighting systems, articulated robotic beam delivery systems, optical switches and remote controls, optical range finders, laser displacement sensors, computer tomography and cameras. Each application requires an efficient and effective optoelectronic device to ascertain the correct coordinates.

Conventionally, various instruments, such as small discrete detector arrays or multi-element sensors, are used to detect the position of incident light. However, photodiode-based position-sensing detectors (PSDs) offer higher position resolution, higher speed response and greater reliability than other solutions. Photodiode-based PSDs convert an incident light spot into continuous position data and are manufactured from semiconductors such as silicon materials. Silicon photodiodes, essentially active solid-state semiconductor devices, are amongst the most popular photo detectors. In addition, silicon photodiodes detect the presence or absence of minute light intensities thereby facilitating correct measurement on appropriate calibration.

The abovementioned silicon photodiode have substantial disadvantages, however. Due to short cut-off wavelength of silicon materials, photodiodes manufactured from silicon are not suitable for applications that involve longer wavelengths such as in communication systems or eye safe detection applications. Therefore, PSDs employing materials other than silicon, such as indium-gallium-arsenide (InGaAs)/indium-phosphide (InP) which have a cut-off wavelength suitable for photo-detection, have been developed.

Conventionally, PSDs employing InGaAs/InP are classified as either one-dimensional or two-dimensional. Two-dimensional PSDs are more useful in ascertaining position than one-dimensional PSDs because they can detect movement in two dimensions and provide adequate details about coordinates. Two-dimensional PSDs are further divided into duo-lateral and tetra-lateral position sensing detectors.

Duo-lateral PSDs typically have two anode electrodes on the front side and two cathode electrodes on the backside. While duo-lateral PSDs have excellent position linearity, they tend to have relatively high dark current, low speed response and complicated application of reverse bias. Duo-lateral PSDs can be disadvantageous in that they are expensive to manufacture as they requires front-to-back mask alignment capability.

Accordingly, there is a need for a tetra-lateral PSD that can be manufactured at a lower cost than a duo-lateral PSD. In addition, there is a need for a tetra-lateral PSD InGaAs/InP photodiode that can be used in a longer wavelength region.

SUMMARY OF THE INVENTION

The present invention is directed toward a position sensing detector comprising a photodiode having an active area, said photodiode comprising a semi insulating substrate layer; a buffered layer, wherein said buffered layer is formed directly atop the semi-insulating substrate layer; an absorption layer, wherein said absorption layer is formed directly atop the buffered layer substrate layer; a cap layer, wherein said cap layer is formed directly atop the absorption layer; a plurality of cathode electrodes electrically coupled to said buffered layer; and at least one anode electrode electrically coupled to a p-type region in said cap layer, wherein said detector is capable of detecting eye-safe wavelengths. Eye-safe wavelengths are at least from 1.3-1.55 µm. The buffered layer comprises InP. The absorption layer comprises InGaAs. The cap layer comprises InP. The photo response non-uniformity is less than 1 micron across said active area. The position detection error, in both the X and Y direction is on the order of 100 µm across the active area. The photodiode comprises four cathode electrodes. Each individual cathode is positioned parallel to the other cathodes and in opposing corners of the photodiode. The photodiode further comprises an anti-reflective layer positioned atop the cap layer. The p-type region in said cap layer is formed by diffusing a region of said cap layer with a suitable dopant to create said p-type region. The dopant is zinc.

In another embodiment, the present invention is directed toward a position sensing detector comprising a photodiode having an active area, said photodiode comprising a semi insulating substrate layer; a buffered layer, wherein said buffered layer is formed directly atop the semi-insulating substrate layer; an absorption layer, wherein said absorption layer is formed directly atop the buffered layer substrate layer; a cap layer, wherein said cap layer is formed directly atop the absorption layer, wherein a p-n junction is formed between said cap layer and said absorption layer; a plurality of cathode electrodes electrically coupled to said buffered layer; and at least one anode electrode electrically coupled to said cap layer. The buffered layer comprises at least one of InGaAs or InP. The absorption layer comprises at least one of InGaAs or InP. The cap layer comprises at least one of InGaAs or InP. The position detection error, in both the X and Y direction is on the order of 100 µm across the active area. The photodiode comprises four cathode electrodes. The p-n junction is formed by diffusing a region of said cap layer with a suitable dopant. The p-n junction is formed by diffusing a region of said absorption layer with a suitable dopant.

In another embodiment, the present invention is directed toward a position sensing detector comprising a photodiode having an active area, said photodiode comprising a semi insulating substrate layer; a buffered layer, wherein said buffered layer is formed directly atop the semi-insulating substrate layer; an absorption layer, wherein said absorption layer is formed directly atop the buffered layer substrate layer; a cap layer, wherein said cap layer is formed directly atop the absorption layer, wherein a p-n junction is formed between said cap layer and said absorption layer; a plurality of cathode electrodes electrically coupled to said cap layer; and at least one anode electrode electrically coupled to said cap layer.

BRIEF DESCRIPTION OF THE DRAWINGS

These and other features and advantages of the present invention will be appreciated, as they become better understood by reference to the following detailed description when considered in connection with the accompanying drawings:

FIG. 7i is a front, cross-sectional view of the PSD, depicting the fabrication step of anode metal lift-off mask lithography on the front side;

DETAILED DESCRIPTION OF THE INVENTION

Figure 1:
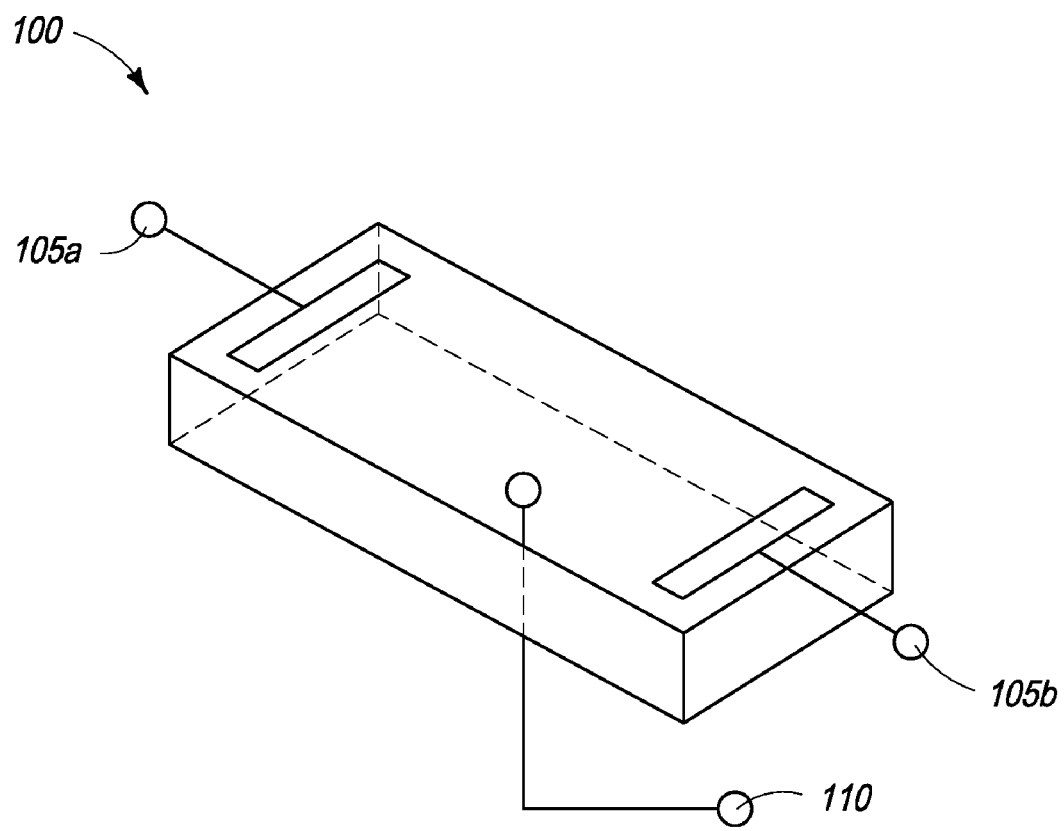
FIG. 1 is a perspective view of a conventional one-dimensional position sensing detector.

The present invention is directed towards a tetra-lateral position-sensing detector (hereinafter, "PSD") comprising an InGaAs/InP photodiode and/or photodiode array that can be used in a longer wavelength region. Specifically, the present invention is directed towards a PSD for detecting light, and more specifically to a tetra-lateral PSD comprised of a photodiode array fabricated from a InP/InGaAs/InP substrate, which can be used in the 800 nm to 3000 nm wavelength region.

In addition, the present invention is directed towards a photodiode array, wherein each photodiode has a total of one anode electrode and four cathode electrodes, all on the front side, which can be manufactured at a lower cost than a duo-lateral PSD. More specifically, each photodiode comprises four cathode electrodes, whereby each individual cathode is positioned parallel to the other cathodes and in opposing corners of the photodiode.

The present invention is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

The present invention comprises a novel PSD chip structure that may be applied to a plurality of fields of use and may be implemented using various materials. In one embodiment, the PSD chip structure of the present invention comprises an anode metal in electrical communication or contact with a P+ diffused cap layer, and a set of four cathodes parallel to the four edges of the chip and in electrical contact or communication with the undiffused N-type InP cap layer. The photodiode chip further comprises a first set of electrodes electrically coupled to the buffered layer, and a second electrode placed parallel to the first electrode and electrically coupled to the cap layer. The PSD chip structure is implemented using, individually or in combination, silicon, gallium-arsenide, indium-gallium-arsenide, indium-phosphide, germanium, mercury-cadmium-telluride layers, indium-arsenide-phosphide (InAsP) or other suitable semiconductor materials known to persons of ordinary skill in the art. Further, the PSD chip structure is implemented such that the semiconductor layers are p-type doped or n-type doped, and diffused as appropriate.

In one embodiment, the tetra lateral photodiode of the present invention is fabricated on a InP/InGaAs/InP as a semiconductor starting material. The use of InGaAs/InP enables a photo-detection error of about 10 μm or less across the active area.

FIG. 1 is a perspective view of a conventional one-dimensional position sensing detector. The position sensing detector 100 consists of a uniform resistive layer formed on one or both surfaces of a high-resistivity semiconductor substrate. The active area of the position sensitive detector 100 has a P-N junction that generates current, by means of photovoltaic effect, which acts as a signal. Under a photovoltaic effect, the photodiodes are either under zero bias or reverse bias and the light falling on the diode causes a voltage to develop across the device, leading to current in the forward direction. Generally, the forward and breakdown voltages at a current of 1 mAmps and 1 μAmps range from 0.8V to 1.1V, and 10V to 26V, respectively. A pair of electrodes 105a, 105b is formed on both ends of top resistive layer, in conjunction with another single electrode 110 at the bottom layer, for extracting position signals.

Figure 2:
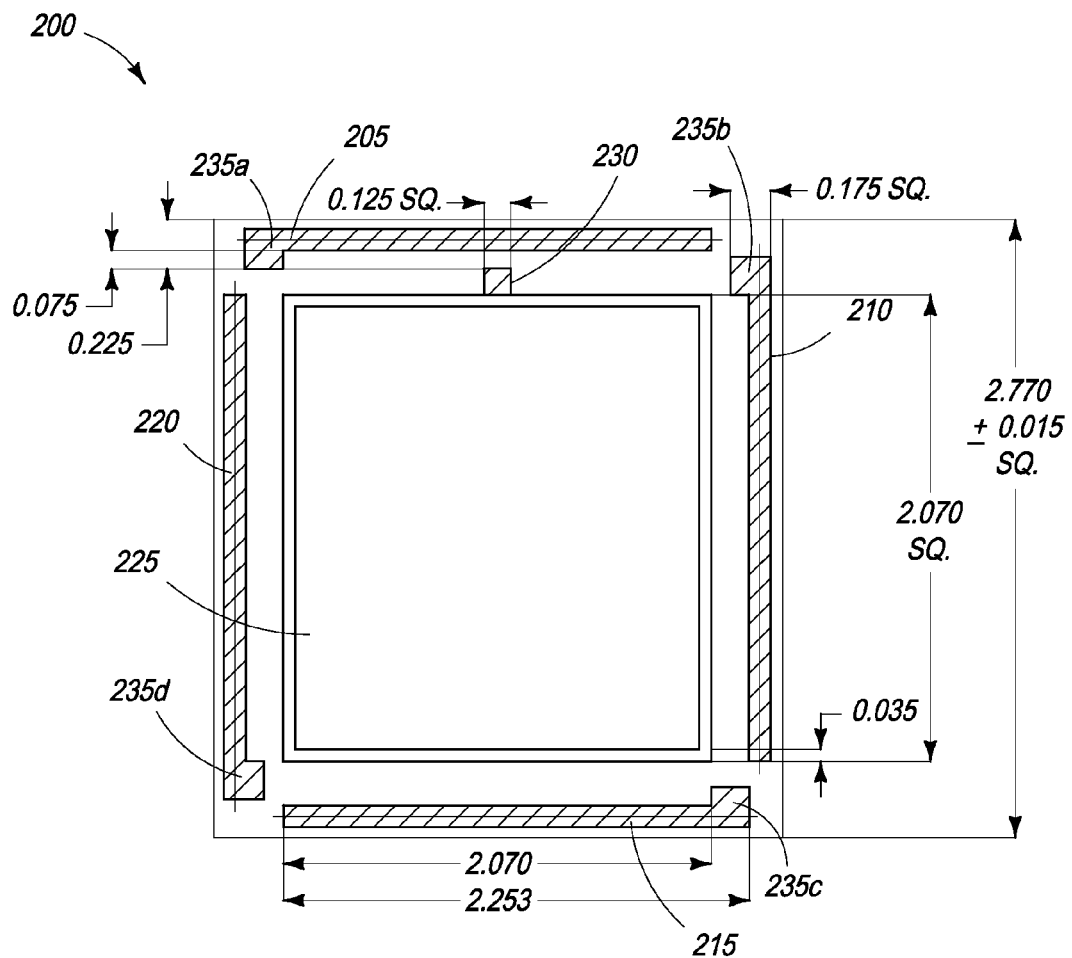
FIG. 2 shows a top, cross-sectional view of a two-dimensional tetra-lateral position sensitive detector.

FIG. 2 shows a top, cross-sectional view of a two-dimensional tetra-lateral position sensitive detector in one embodiment of the present invention. The tetra-lateral, position-sensing detector 200 comprises a first side 205 having a wire bonding pad for anode 230. In addition, the tetra-lateral PSD 200 further comprises second side 210, third side 215, and fourth side 220. The first side 205, second side 210, third side 215, and fourth side 220 further comprise wire bonding pads for cathodes 235a, 235b, 235c, and 235d respectively. The anode pad 230 of the position sensitive detector 200 is in electrical contact with a doped P-type InP cap layer (not shown) and cathode pads 235a, 235b, 235c, and 235d are in electrical contact with an N-type InP cap layer (not shown).

In one embodiment of the present invention the first side 205, second side 210, third side 215, and fourth side 220 of position sensitive detector are on the order of 2.070×2.070 mm. In an embodiment of the present invention, the wire bonding pads for cathode, 235a through 235d, are on the order of 0.15 mm×0.15 and the wire bonding pad for anode 230 is on the order of 0.125 mm×0.2 mm. It should be noted herein that while exemplary dimensions are listed for the wire bonding pads, the design can be modified in alternate embodiments, with the requirement that the wire bonding pads should be large enough for convenient and effective wire bondages.

In addition, tetra-lateral PSD 200 also comprises active area 225. The active area 225 receives light, converts it into photocurrents and transfers it to a plurality of electrodes for ascertaining position coordinates of the incident light. In one embodiment of the present invention, the active area 225 of the position sensitive detector 200 is on the order of 2 mm×2 mm. It should be noted herein that the active area 225 can be of any dimension, including, but not limited to 2 mm×3 mm, 3 mm×3 mm, and 3 mm×6 mm, among other dimensions.

Figure 3:
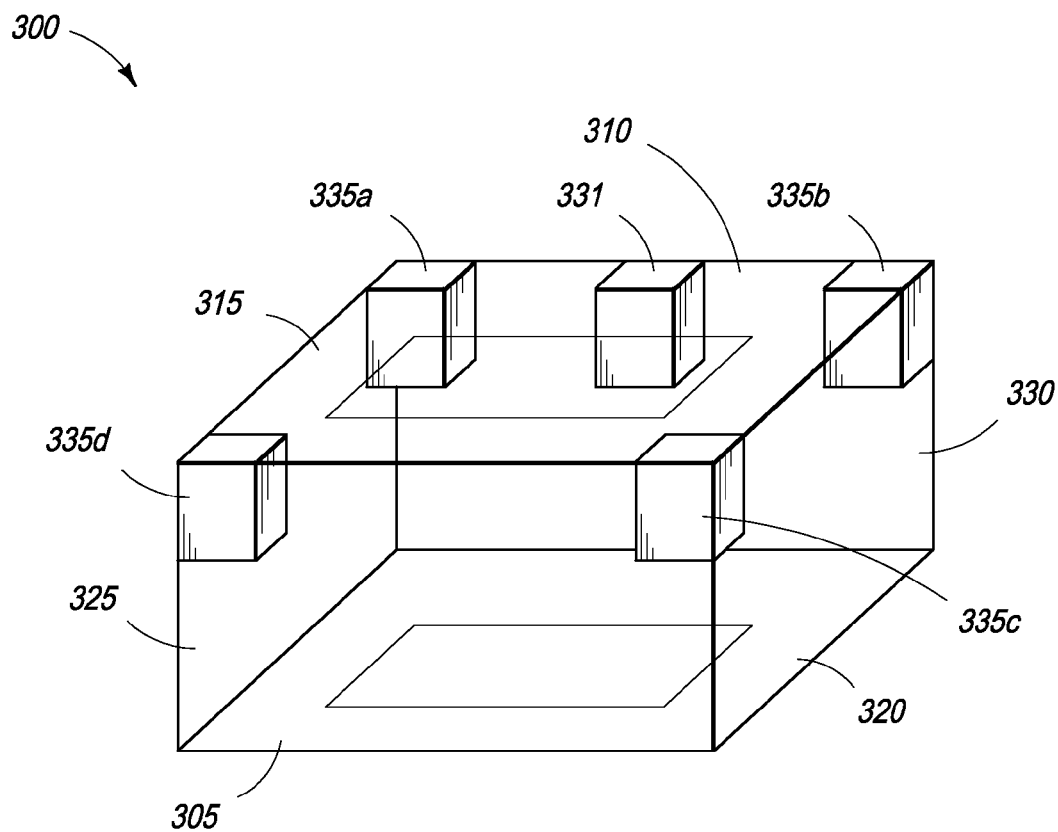
FIG. 3 shows a perspective side view of one embodiment of the tetra-lateral position sensitive detector of the present invention.

FIG. 3 shows a perspective side view of one embodiment of the tetra-lateral position sensitive detector of the present invention. In one embodiment, the tetra lateral position sensitive detector 300 is cuboidal comprising a plurality of sides, also referred to as faces or facets. The cuboid-shaped position sensitive detector 300 has six distinct facets: proximate 305, distant 310, top 315, bottom 320, left 325, and right 330. The position sensitive detector 300 further includes two sets of electrodes on the top facet 315. A first electrode 331 functions as anode and a second set of electrodes 335a, 335b, 335c and 335d function as cathodes. In one embodiment the chip thickness of the position sensitive detector 300 is 0.200 (+/−) 0.015 mm. Persons of ordinary skill in the art would appreciate that the present designation/dimension of position sensitive detector is not limited to the description provided herein and can be adjusted to suit other design, fabrication, and functional specifications. The chip can be of any thickness in alternate embodiments.

Figure 4:
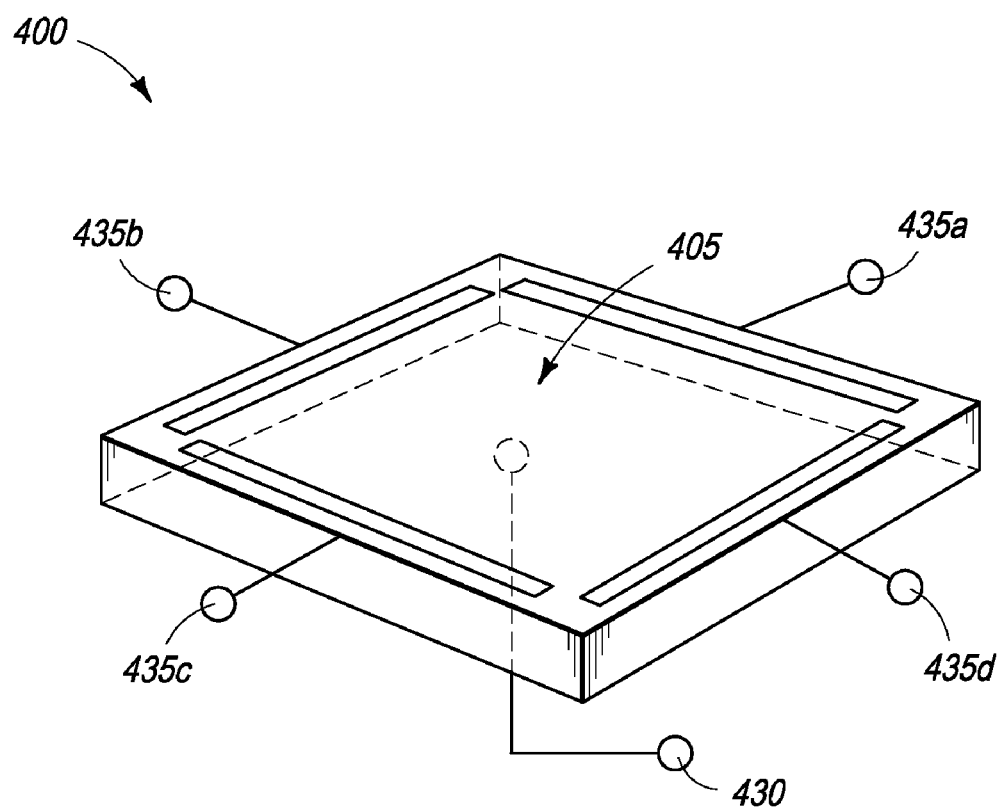
FIG. 4 shows a top, perspective view of the tetra lateral position sensitive detector of the present invention.

FIG. 4 shows a top, perspective view of the tetra lateral position sensitive detector 400 of the present invention. The four electrodes 435a, 435b, 435c and 435d function as a cathode and the fifth electrode 430 functions as an anode. In one embodiment, inter-electrode resistance is measured at the operational voltage. In one embodiment of the present invention, the inter-electrode, and more specifically, inter-cathode resistance along the horizontal axis and the vertical axis, at a reverse bias of −5V, ranges from 2 to 2.5 KOhm. In one embodiment of the present invention, the inter-cathode resistance along the horizontal axis and the vertical axis is 2.5 KOhm.

During operation, when light falls on active area 405 of the position sensitive detector 400, photocurrent is generated which flows from the point of light incidence through the resistive layer to the electrodes 430 and 435a, 435b, 435c, and 435d. The photocurrent generated is inversely proportional to the resistance between the incident light spot and the electrodes. When the input light spot is exactly at the device center, current signals having equal strength are generated. When the light spot is moved over the active area 405, the amount of current generated at the electrodes determines the exact light spot position at each instant of time since the electrical signals are proportionately related to the position of the light spot from the center. In one embodiment of the present invention the tetra-lateral PSD comprises a single resistive layer, where the photocurrent is divided into two parts for one-dimensional sensing or, in the alternative, four parts for two-dimensional sensing.

Figure 5:
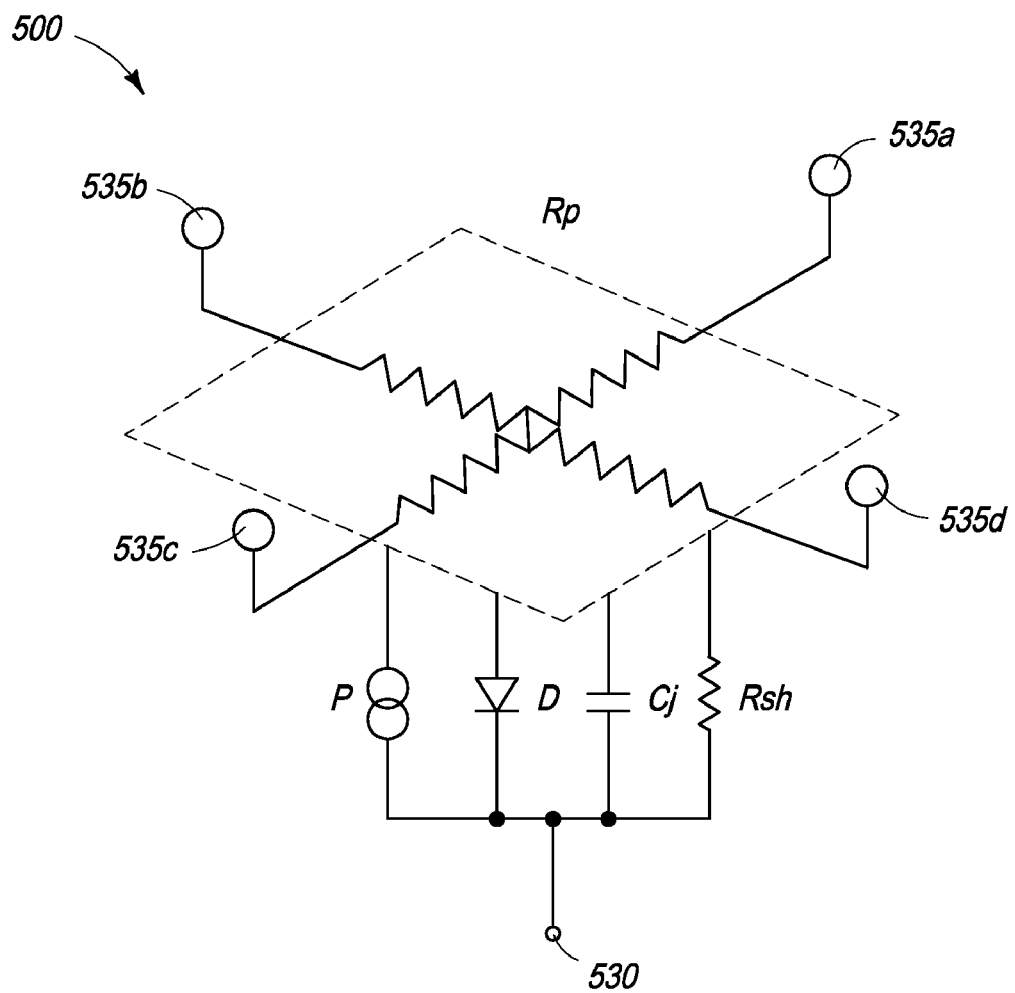
FIG. 5 shows an equivalent circuit of the tetra-lateral position sensing detector of the present invention.

FIG. 5 shows an equivalent circuit 500 of the tetra-lateral position sensing detector of the present invention, shown as 400 in FIG. 4. The values of position resistance Rxx and position resistance Ryy are set by the thickness and doping concentration of the buffered layer. Photocurrent is divided into 4 parts through the same resistive layer (buffered layer) and collected as position signals from the four electrodes 535a, 535b, 535c, and 535d. Also, as shown in FIG. 5, P is the current generator, D is ideal diode, Cj is junction capacitance, and $R_{sh}$ is shunt resistance. In one embodiment of the present invention, the shunt resistance at −10 mV ranges from 1 to 8 MOhms and the capacitance at 0V and at −5V ranges from 322 to 900 pico farads (pF) and 176 to 375 pF, respectively.

The electrodes 535a, 535b, 535c, 535d extract a first current component and the electrode 530 extracts a second current component. Both such current component values are then used to determine the coordinates of the light spot based on appropriate equations as evident to those of ordinary skill in the art.

Thus, the position of centroid of the incident light spot is indicated along with generating electrical output signals proportional to the displacement from the center. The input light beam may be of any size and shape.

In various embodiments, the responsivity of the PSD at a wavelength of 1300 nm ranges from 0.85 to 0.959 A/W and at a wavelength of 1550 nm ranges from 0.95 to 1.15 A/W. In one embodiment of the present invention, the minimum responsivity of the PSD at a wavelength of 1300 nm is 0.90 A/W and at a wavelength of 1550 nm is 0.95 A/W. The responsivity of a position sensitive detector is a measure of the sensitivity to light, and is the ratio of the photocurrent to the incident light power at a given wavelength. According to an aspect of the present invention, the position detection error, in both the X and Y direction is on the order of 100 μm across the active area.

Figure 6:
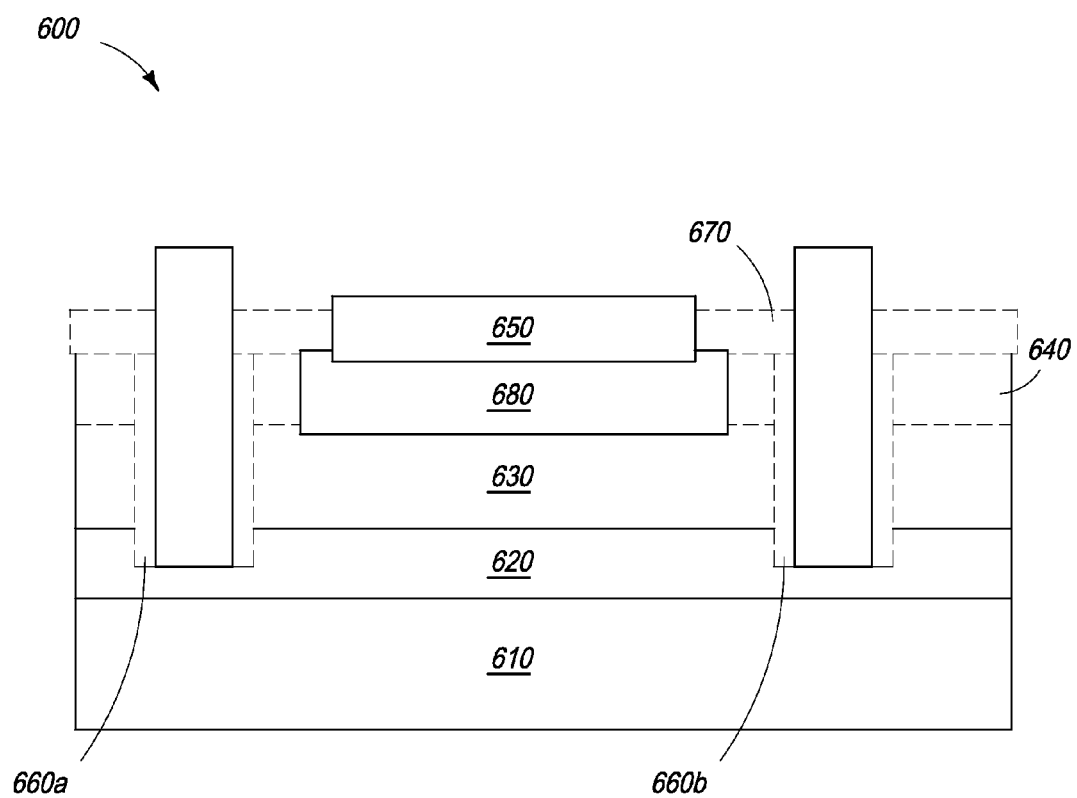
FIG. 6 is a cross-sectional view of another embodiment of the two-dimensional position sensing detector of the present invention.

FIG. 6 is a cross-sectional view of another embodiment of the two-dimensional position sensing detector 600 of the present invention. In one embodiment, an InP buffered layer 620 is formed over a semi-insulating substrate layer 610. An InGaAs absorption layer 630 is further formed over the buffered layer 620 and an InP cap layer 640 is then formed over the absorption layer 630. The InP layer 640 is used to keep surface dark current low, since InP is a wide bandgap semiconductor.

In one embodiment, two sets of output electrodes (four cathodes and one anode) that correspond to two dimensions are used. A first set of electrodes 660a and 660b (shown), 660c and 660d (not shown) are either electrically coupled to the InP buffered layer 620 or directly to the surface of the cap layer 640, and function as cathodes. It should be noted herein that the cathodes 660a, 660b, 660c, and 660d are formed from a deep well etch process to achieve metal contact with the buffered layer. It is preferred, however, in the present invention, as described with respect to FIG. 7q that the cathode metal contacts the surface of the cap layer 640 only. Electrodes 660a and 660b are substantially parallel to each other and are each disposed near opposite ends of the PSD 600. Similarly, electrodes 660c and 660d are parallel to each other and are disposed on the other end of the PSD 600. An electrode 650 is electrically coupled to the p-type region 680 of the InP layer 640 and functions as anode.

In one embodiment of the present invention, InGaAs layer 630 functions as an i-layer. An anti-reflective layer 670, such as for example, silicon nitride, is preferably positioned over the InP layer 640 as a means to control reflection and to passivate the surface of the junction. To create a p-n junction, an area on the cap layer 640 is diffused with a metal, for example, zinc to make the p-type region 680 have, in one embodiment, a concentration in the range of $1 \times 10^{16}$ atoms/$cm^3$ to $1 \times 10^{19}$ atoms/$cm^3$. In another embodiment, the concentration of the p-type region is at least $1 \times 10^{18}$ atoms/$cm^3$. At the junction of the p-type region 680 and the n-type doped semiconductor layer 630, a P-N junction is formed.

In another embodiment p-type region 680 is created by diffusing zinc to the InGaAs layer 630. In addition, the buffered layer 620 and cap layer 640 may be InGaAs instead of InP as illustrated in FIG. 6.

Operationally, the diode 600 is reverse biased, causing a depletion region to extend through the InGaAs intrinsic layer 630 to the n-buffered layer 620. When light hits the position sensing detector 600, the light reaches the InGaAs absorption layer 630, where it is absorbed and charge carriers (holes and electrons) are generated by virtue of a photovoltaic effect. As the p-type carriers drift towards the top InP layer 640 and flow into the anode 650, the n-type carriers drift towards the InP substrate layer 610 and are collected by the cathodes 660a, 660b, 660c and 660d (of which 660c and 660d are not shown in FIG. 6). The currents collected are measured and the position is determined in accordance with methods well known in the art.

The manufacturing process of one embodiment of the position sensing detector (PSD) of the present invention will now be described in greater detail. Persons of ordinary skill in the art should note that although one exemplary manufacturing process is described herein, various modifications may be made without departing from the scope and spirit of the invention.

Figure 7A:
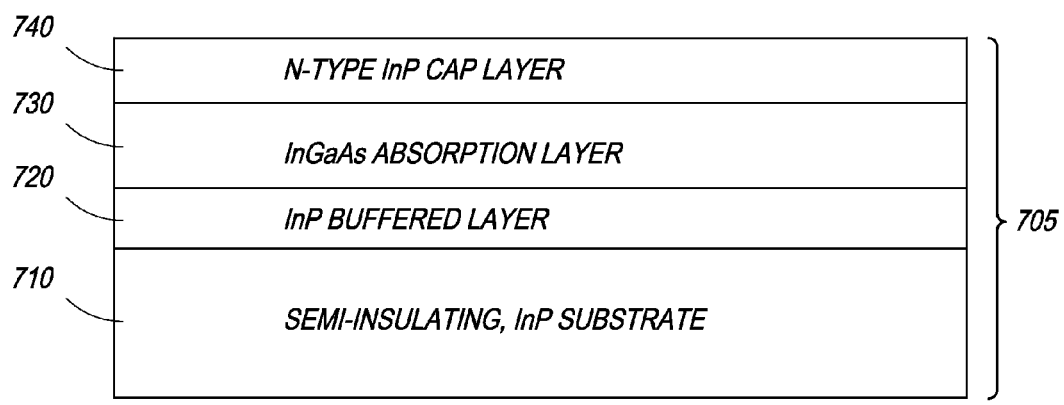
FIG. 7a is a front, cross-sectional view showing the starting material for fabricating one embodiment of the position sensing detector (PSD) of the present invention.
Figure 7B:
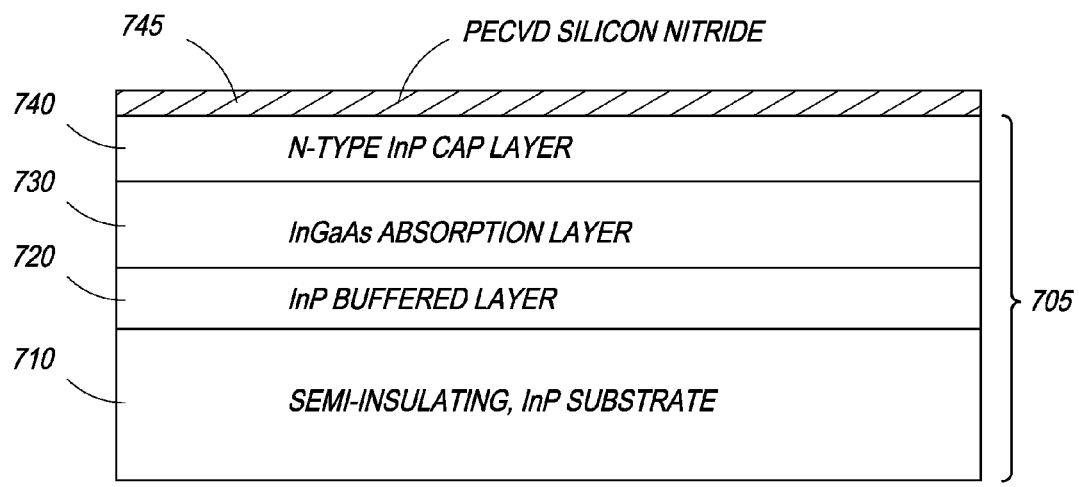
FIG. 7b is a front, cross-sectional view of the PSD, depicting the fabrication step of deposition of PECVD silicon nitride on a front side.
Figure 7C:
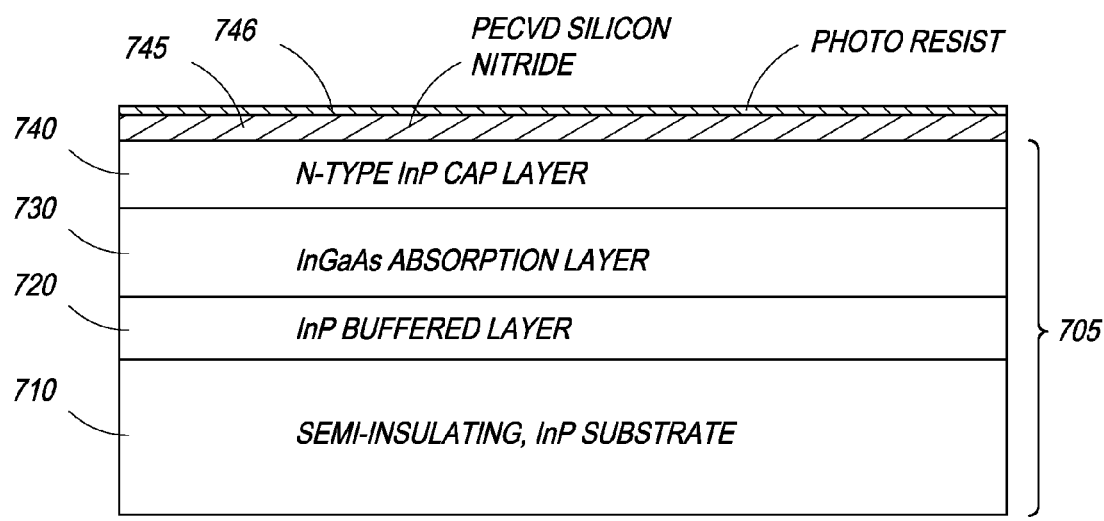
FIG. 7c is a front, cross-sectional view of the PSD, depicting the fabrication step of coating the front side with a photoresist layer.
Figure 7D:
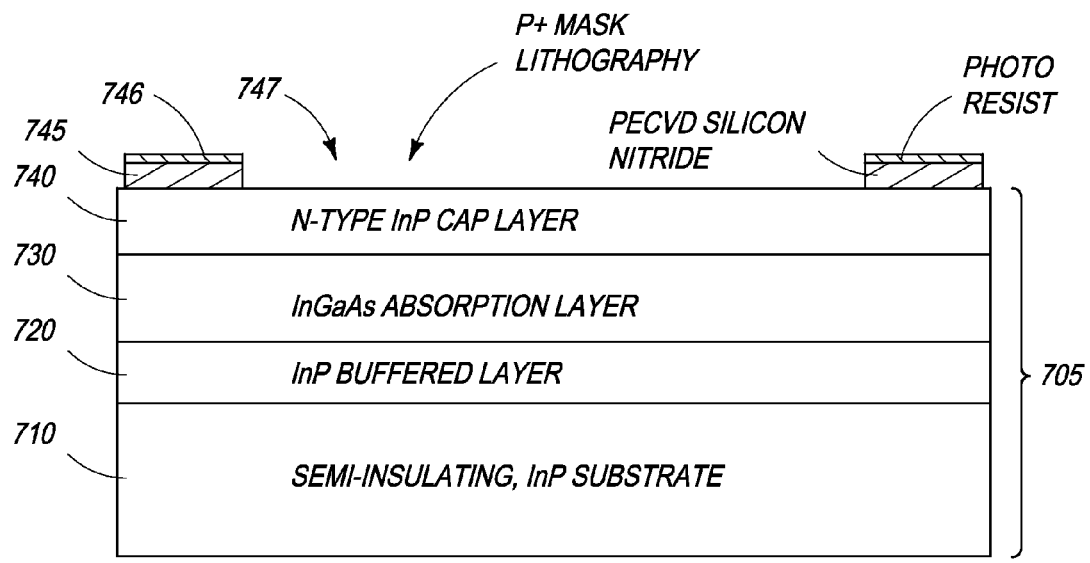
FIG. 7d is a front, cross-sectional view of the PSD, depicting the fabrication step of p+ mask lithography on the front side.
Figure 7E:
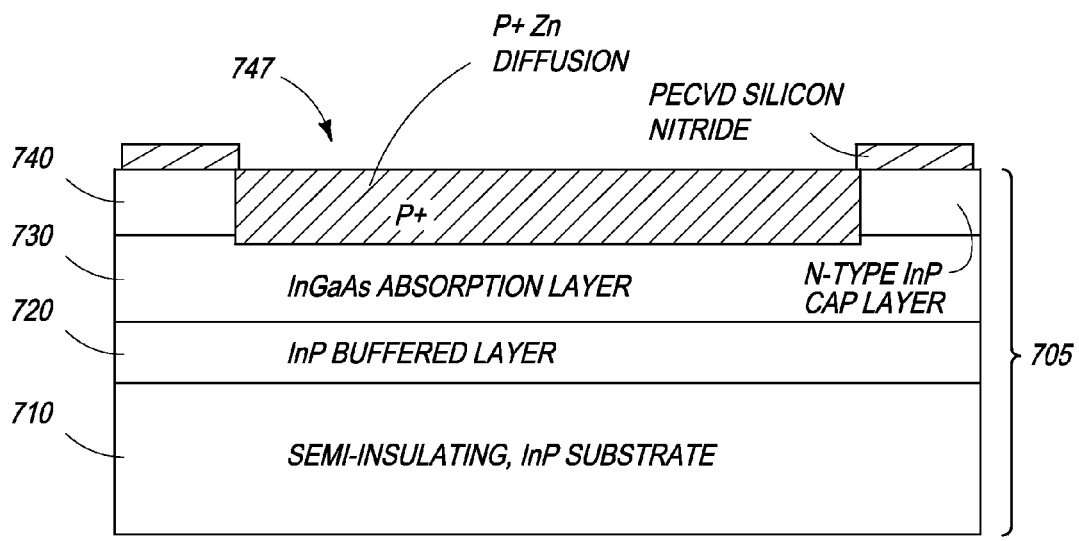
FIG. 7e is a front, cross-sectional view of the PSD, depicting the fabrication step of p+ Zn diffusion on the front side.
Figure 7F:
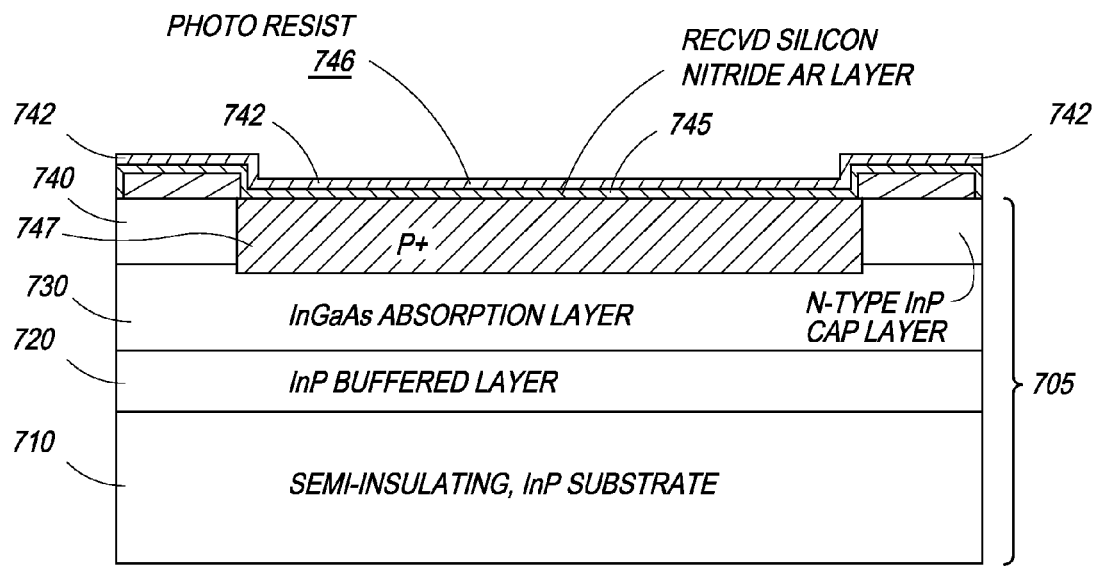
FIG. 7f is a front, cross-sectional view of the PSD, depicting the fabrication step of depositing PECVD silicon nitride, anti-reflective layer and photoresist.
Figure 7G:
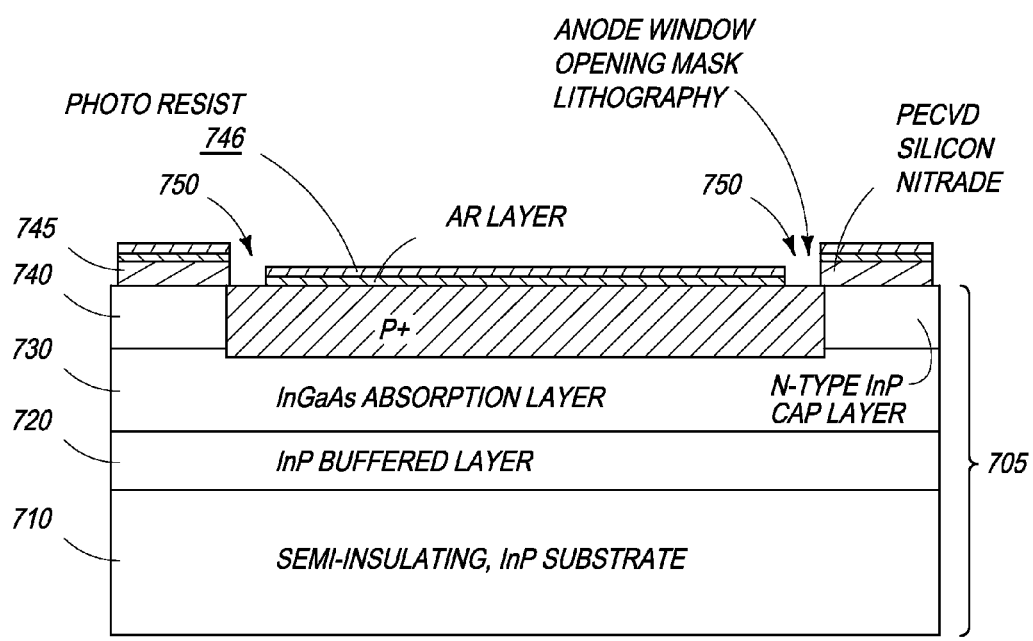
FIG. 7g is a front, cross-sectional view of the PSD, depicting the fabrication step of mask lithography for opening an anode window.
Figure 7H:
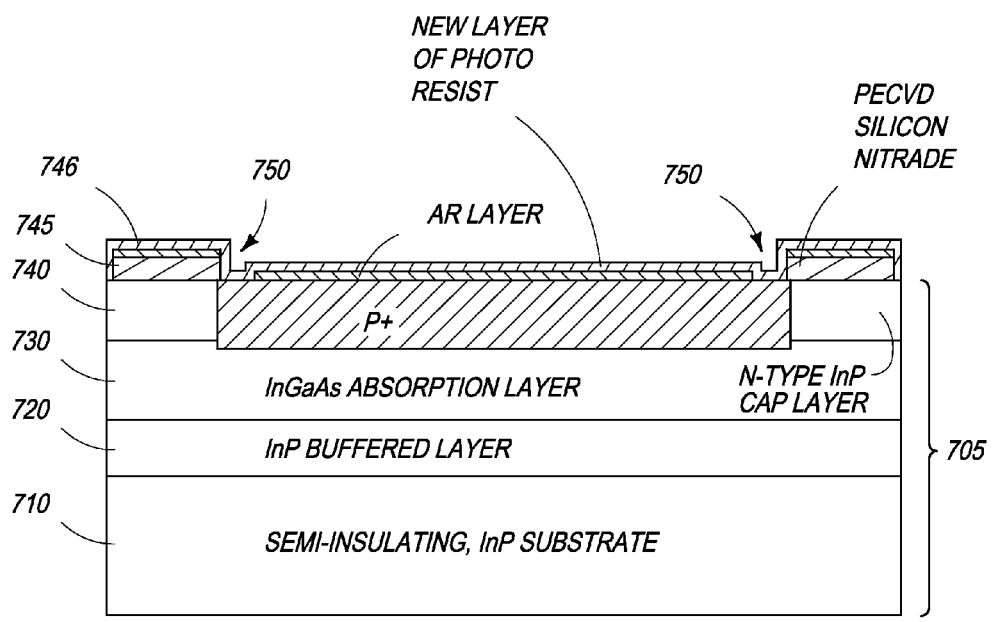
FIG. 7h is a front, cross-sectional view of the PSD, depicting the fabrication step of coating the front side with a photoresist layer.
Figure 71:
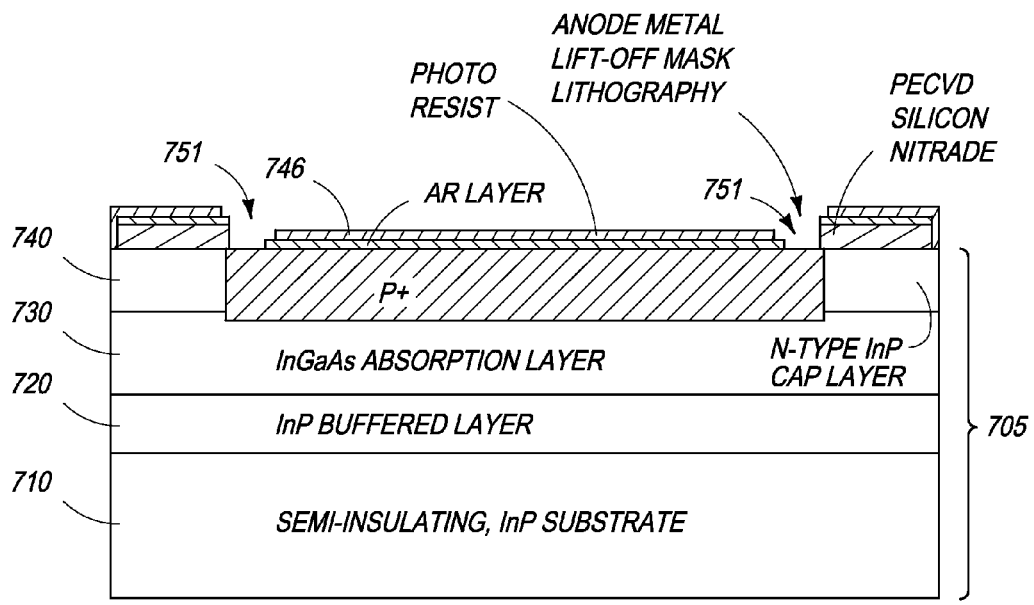
Figure 7J:
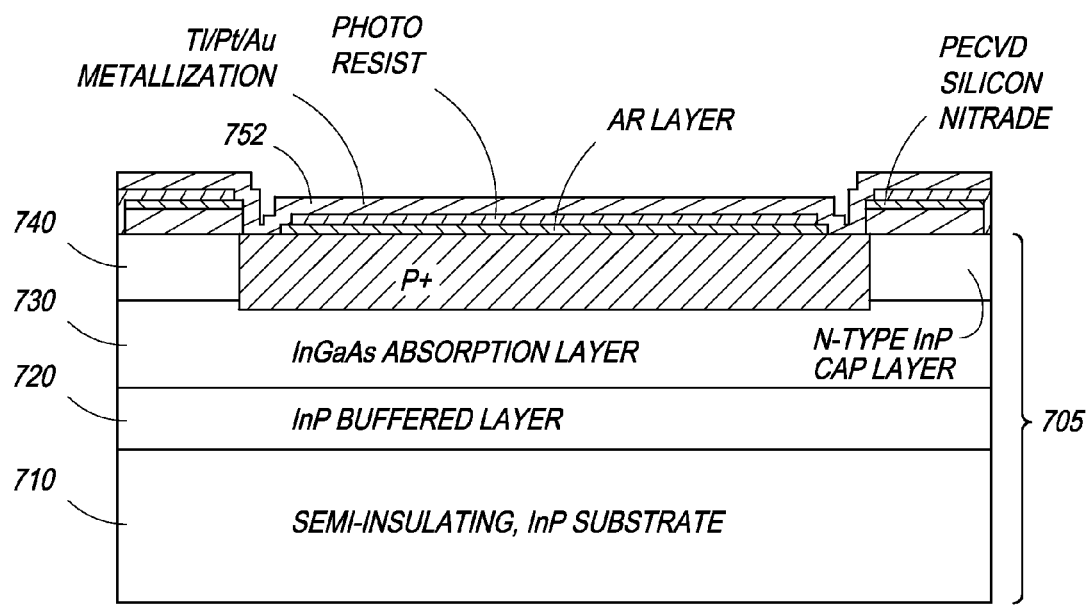
FIG. 7j is a front, cross-sectional view of the PSD, depicting the fabrication step of evaporating metal on the front side.
Figure 7K:
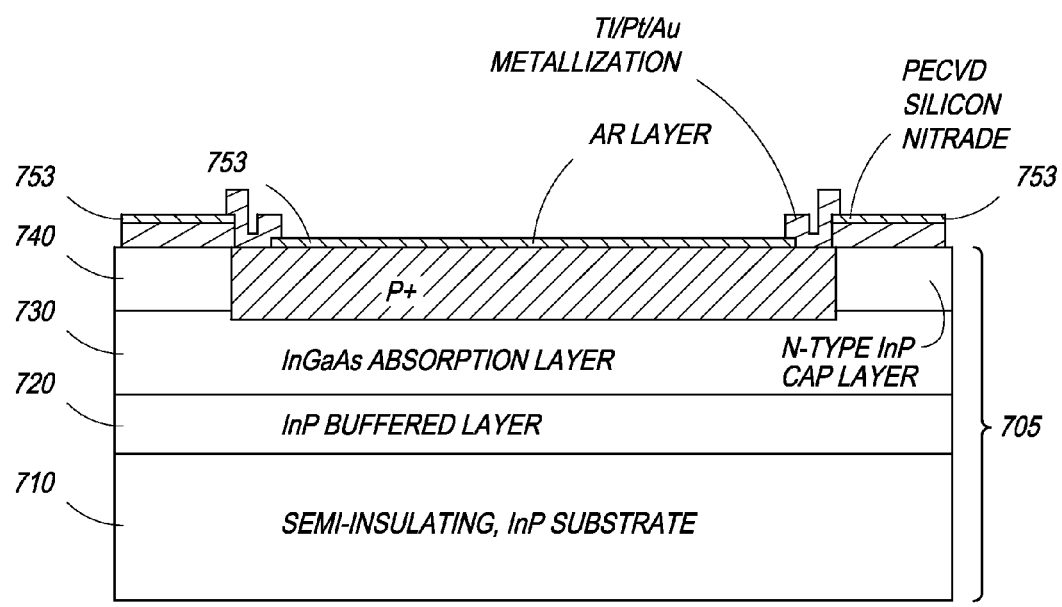
FIG. 7k is a front, cross-sectional view of the PSD, depicting the fabrication step of photoresist lift-off on the front side.
Figure 7L:
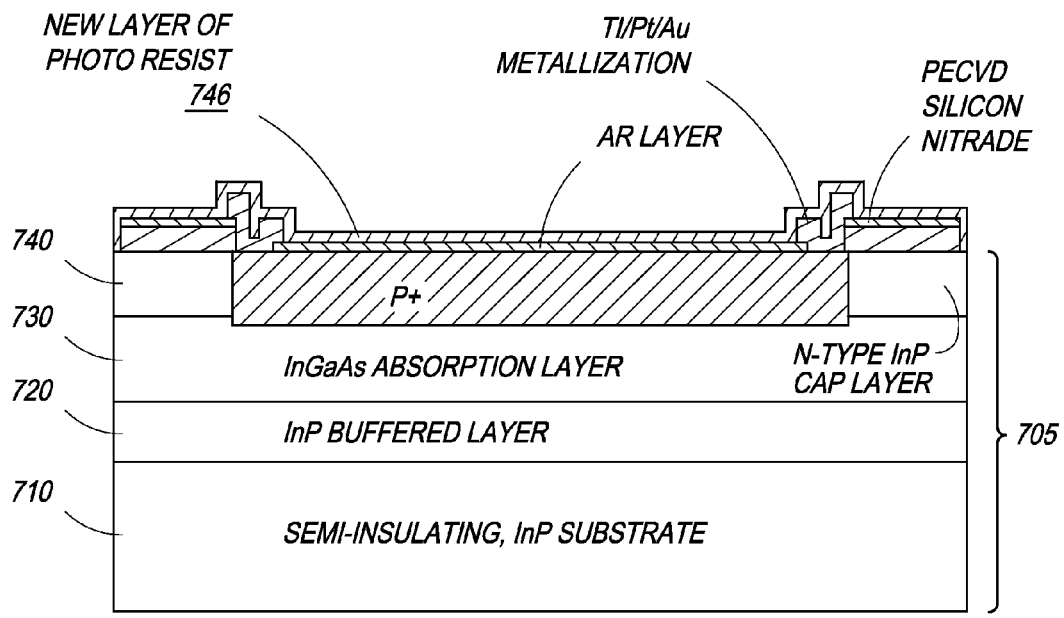
FIG. 7l is a front, cross-sectional view of the PSD, depicting the fabrication step of coating the front side with a photoresist layer.
Figure 7M:
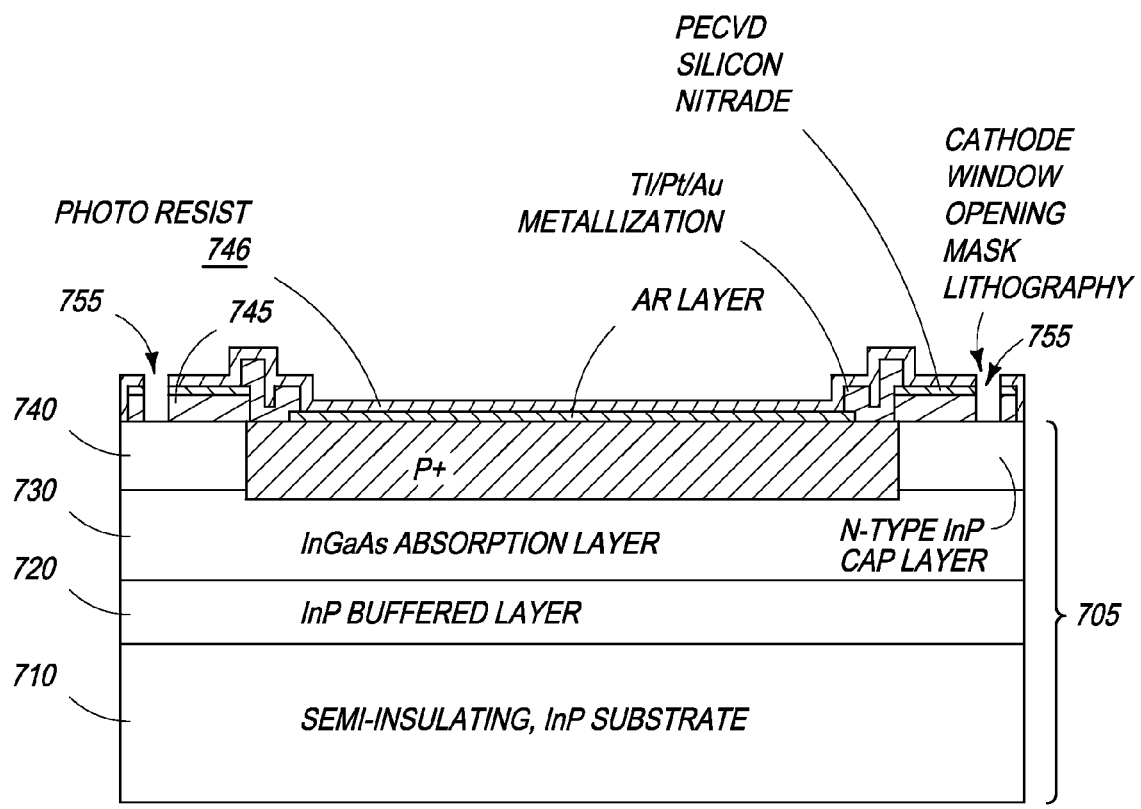
FIG. 7m is a front, cross-sectional view of the PSD, depicting the fabrication step of mask lithography for opening a cathode window on the front side.
Figure 7N:
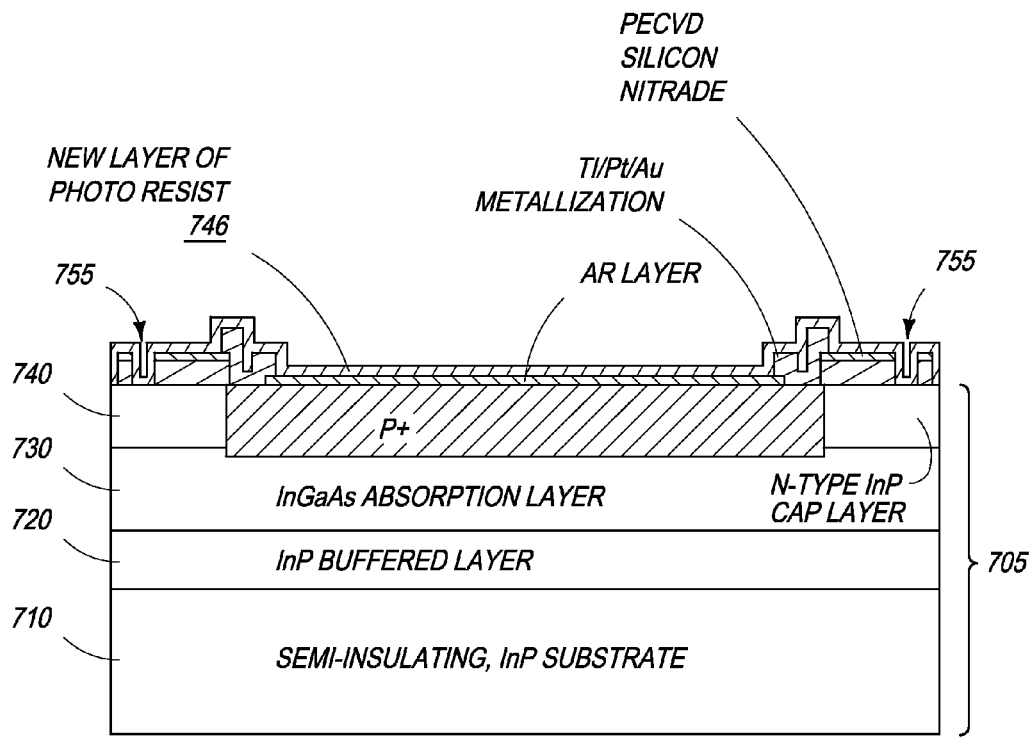
FIG. 7n is a front, cross-sectional view of the PSD, depicting the fabrication step of coating the front side with a photoresist layer.
Figure 7O:
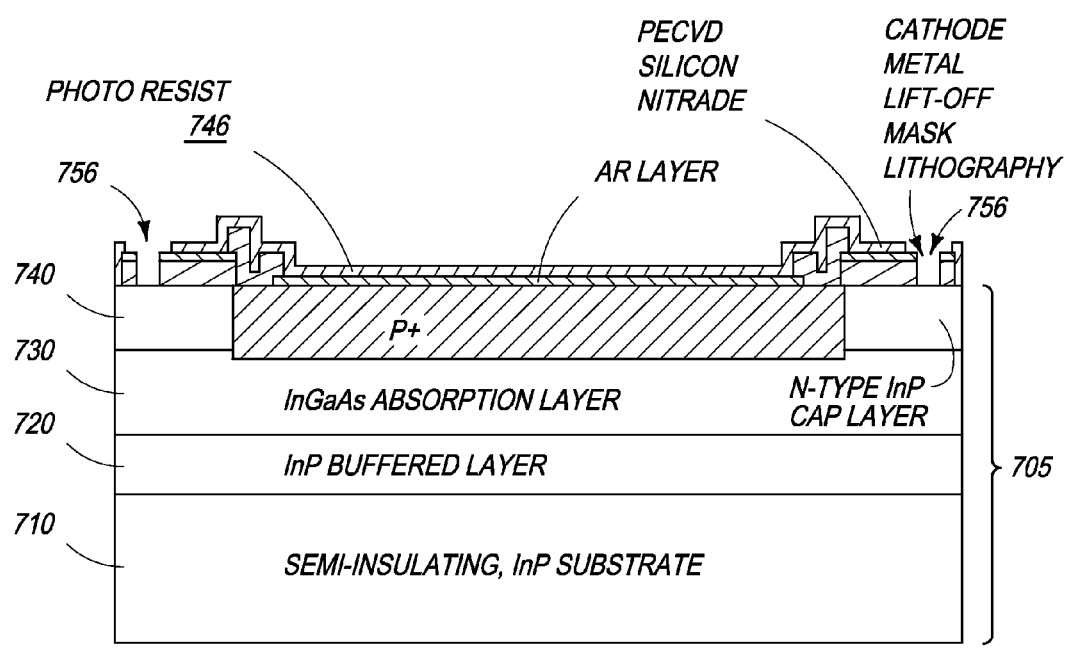
FIG. 7o is a front, cross-sectional view of the PSD, depicting the fabrication step of cathode metal lift-off mask lithography on the front side.
Figure 7P:
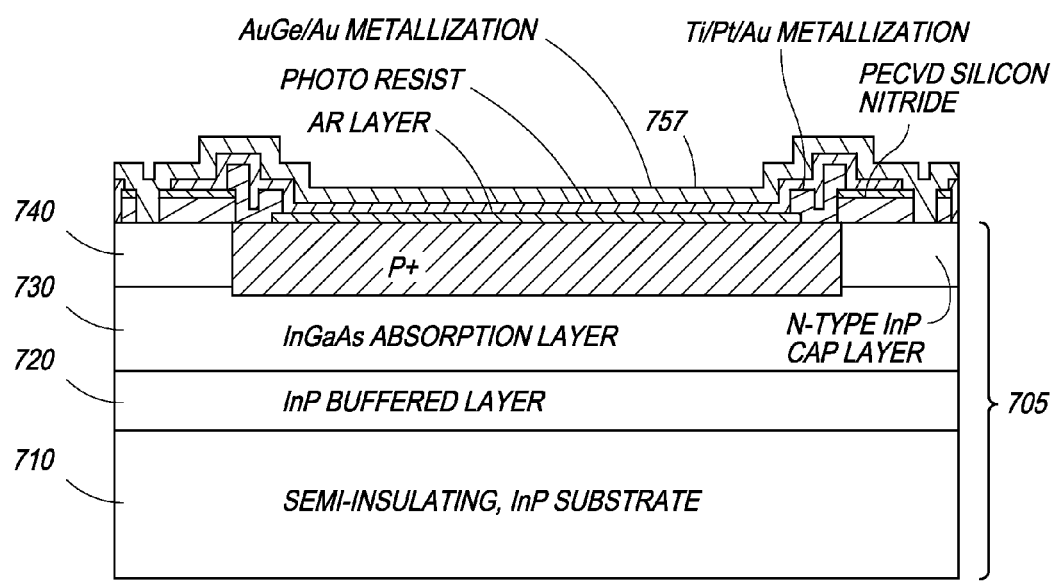
FIG. 7p is a front, cross-sectional view of the PSD, depicting the fabrication step of evaporating metal on the front side.
Figure 7Q:
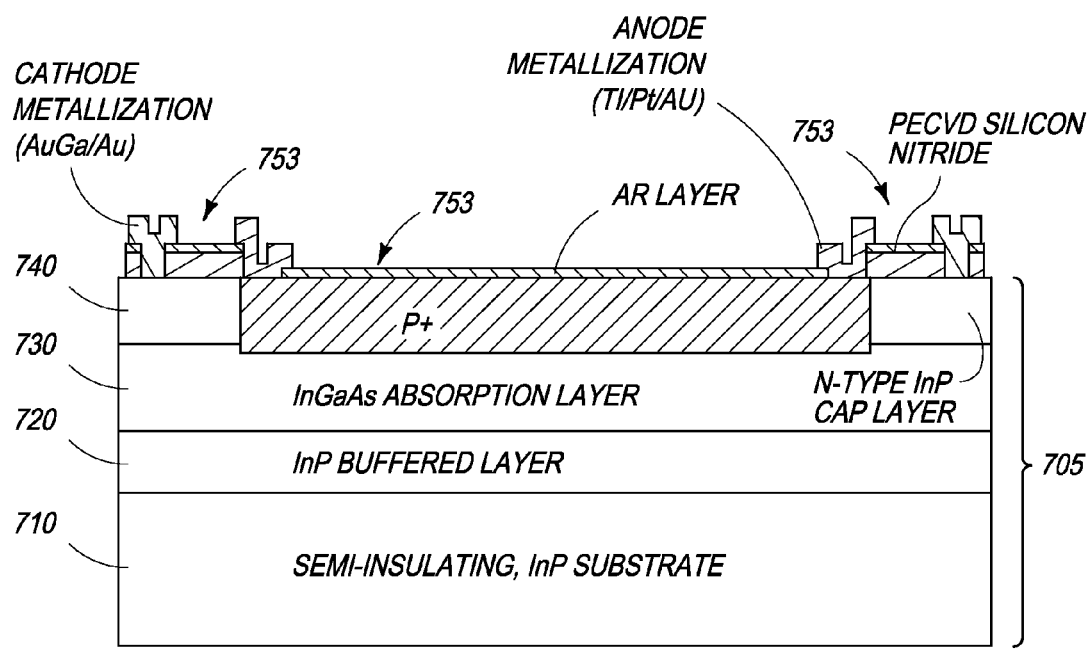
FIG. 7q is a front, cross-sectional view of the PSD, depicting the fabrication step of photoresist lift-off on the front side.

Reference is now made to FIG. 6, which is a cross sectional view of one embodiment of the PSD of the present invention, and FIGS. 7a through 7q which are also cross-sectional views of the PSD of FIG. 6, illustrating exemplary manufacturing steps of the embodiment. Modifications or alterations to the manufacturing steps, their corresponding details, and any order presented may be readily apparent to those of ordinary skill in the art. Thus, the present invention contemplates many possibilities for manufacturing the photodiode array of the present invention and is not limited to the examples provided herein.

Referring now to FIG. 7a, in step 781, a device starting material 705 is formed, and comprises semi-insulating substrate 710, which in one embodiment, is InP. A buffered layer 720 is formed over the semi-insulating substrate 710, which in one embodiment, is InP. An absorption layer 730, which in one embodiment is InGaAs, is then formed over the buffered layer 720. A cap layer 740 is then formed over the absorption layer 730. The cap layer 740 is preferably n-type, and in one embodiment, is formed from InP. While it is preferred that the substrate, buffered and cap layers 710, 720, 740 respectively are of InP while the absorption layer 730 be comprised of InGaAs, one of ordinary skill in the art would appreciate that any suitable semiconductor material, which can be processed in accordance with the processing steps of the present invention, may be used. In addition, device wafer layers 710, 720, 730 and 740 are, in one embodiment, polished on both sides to allow for greater conformity to parameters, surface flatness, and specification thickness. It should be understood by those of ordinary skill in the art, however, that the above specifications are not binding and that the type of material can easily be changed to suit the design, fabrication, and functional requirements of the present invention.

In step 782, as shown in FIG. 7b, the device material 705 is subjected to Plasma-Enhanced Chemical Vapor Deposition (PECVD) of silicon nitride 745 at the front side. PECVD of silicon nitride is employed for passivation to prevent oxidation of the exposed surface of the cap layer 740.

In step 783, as shown in FIG. 7c, a photoresist layer 746 is deposited, over the silicon nitride layer 745, to enable further etching of a specific pattern on the surface of the device material 705. Generally, the photoresist layer 746 is a photosensitive polymeric material for photolithography and photoengraving that can form a patterned coating on a surface. Thus, after selecting a suitable material and creating a suitable photoresist pattern, the thin photoresist layer 746 is applied to the front side of device material 705. In one embodiment, the photoresist layer is applied via a spin coating technique. Spin coating is well known to those of ordinary skill in the art and will not be described in detail herein.

Referring now to FIG. 7d, at step 784, the device material 705 is subjected to p+ mask lithography on front side. P+ masking is employed to protect portions of device material 705. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the p+ mask comprises a plurality of diffusion windows with appropriate geometrical and dimensional specifications. The photoresist coated device material 705 is aligned with the p+ mask. Light, such as ultraviolet light, is projected through the mask, exposing the photoresist layer 746 in the pattern of the p+ mask. The p+ mask allows selective irradiation of the photoresist 746 on the device wafer 705. Photoresist area that are exposed to UV light will be removed while those that are shielded by the P+ mask are hardened by a subsequent post-exposure development bake. Regions that are exposed to radiation are hardened while those that are reserved for diffusion remain shielded by the p+ mask and easily removed. The exposed and remaining photoresist is then subjected to a suitable chemical or plasma etching process to reveal the pattern transfer from the mask to the photoresist layer 746. An etching process is then employed to remove the silicon nitride layer 745 from the front side of the device material 705. In one embodiment, the pattern of the photoresist layer 746 and/or p+ mask defines regions 747, on the front side, devoid of the nitride and photoresist layers deposited in step 782 and ready for p+ diffusion.

Now referring to FIG. 7e, in step 785, the front side of the device 705 is subjected to p+ diffusion 747 followed by drive-in oxidation after the previous p+ masking and etching step 784. Generally, diffusion facilitates propagation of a diffusing material through a host material. In step 785, an appropriate amount of dopant atoms, such as zinc, is deposited onto the substrate device 705 and fills the gaps 747 left by the removed photoresist and silicon nitride layers. Thereafter, in step 786 of FIG. 7f, exposed surfaces 742 are passivated with re-deposition of PECVD silicon nitride layer 745 followed by a coating of photoresist layer 746.

As shown in FIG. 7g, at step 787, the device material 705 is subjected to mask lithography on front side for creating/opening anode windows 750. In one embodiment, the anode-opening mask comprises a plurality of diffusion windows with appropriate geometrical and dimensional specifications. The photoresist coated device material 705 is aligned with the anode-opening mask. A light, such as UV light, is projected through the mask, exposing the photoresist layer 746 in the pattern of the anode-opening mask. The mask allows selective irradiation of the photoresist 746 on the device wafer 705.

An etching process is then employed to remove the silicon nitride layer 745 from the front side of the device material 705. In one embodiment, the pattern of the photoresist layer 746 and/or anode-opening mask defines regions 750, on the front side, devoid of the nitride layer to be used as anode windows 750. Thereafter, in step 788 of FIG. 7h, exposed anode regions 750 and the entire front side are re-coated with a new layer 746 of photoresist.

At step 789, as shown in FIG. 7i, anode metal lift-off mask lithography is performed on the front side of the device wafer 705. As know to persons of ordinary skill in the art, the lift-off process allows for patterning of the photoresist layer 746 before metallization or before metal is evaporated over the resist. Thus, the lift-off mask lithography results in patterned regions 751. This is followed by metallization 752 on the front side of the device wafer 705 at step 790 of FIG. 7j.

Referring now to FIG. 7k, at step 791, the photoresist, of the earlier step, is lifted off from the front side, exposing anti-reflective layer 753, followed by a re-coat of the front side with a new layer of photoresist 746 at step 792 of FIG. 7l.

As shown in FIG. 7m, at step 793, the device wafer 705 is subjected to mask lithography on front side for creating/opening cathode windows 755. In one embodiment, the cathode-opening mask comprises a plurality of diffusion windows with appropriate geometrical and dimensional specifications. The photoresist coated device material 705 is aligned with the anode-opening mask. A light, such as ultra-violet light, is projected through the mask, exposing the photoresist layer 746 in the pattern of the cathode-opening mask. The mask allows selective irradiation of the photoresist 746 on the device wafer 705. Regions that are exposed to radiation are hardened while those that are reserved for diffusion remain shielded by the mask and easily removed. The exposed and remaining photoresist is then subjected to a suitable chemical or plasma etching process to reveal the pattern transfer from the mask to the photoresist layer 746. An etching process is then employed to remove the silicon nitride layer 745 from the front side of the device material 705. In one embodiment, the pattern of the photoresist layer 746 and/or cathode-opening mask defines regions 755, on the front side, devoid of the nitride layer to be used as cathode windows 755. Thereafter, in step 794 of FIG. 7n, exposed cathode regions 755 and the entire front side are re-coated with a new layer 746 of photoresist.

At step 795, as shown in FIG. 7o, cathode metal lift-off mask lithography is performed on the front side of the device wafer 705. As know to persons of ordinary skill in the art, the lift-off process allows for patterning of the photoresist layer 746 before metallization or metal is evaporated over the resist. Thus, the lift-off mask lithography results in patterned regions 756. This is followed by cathode metallization 757 on the front side of the device wafer 705 at step 796 of FIG. 7p. Finally at step 797 of FIG. 7q the photoresist, of the earlier step is lifted off from the front side of the device wafer 705, exposing the anti-reflective layer 753.

Figure 8:
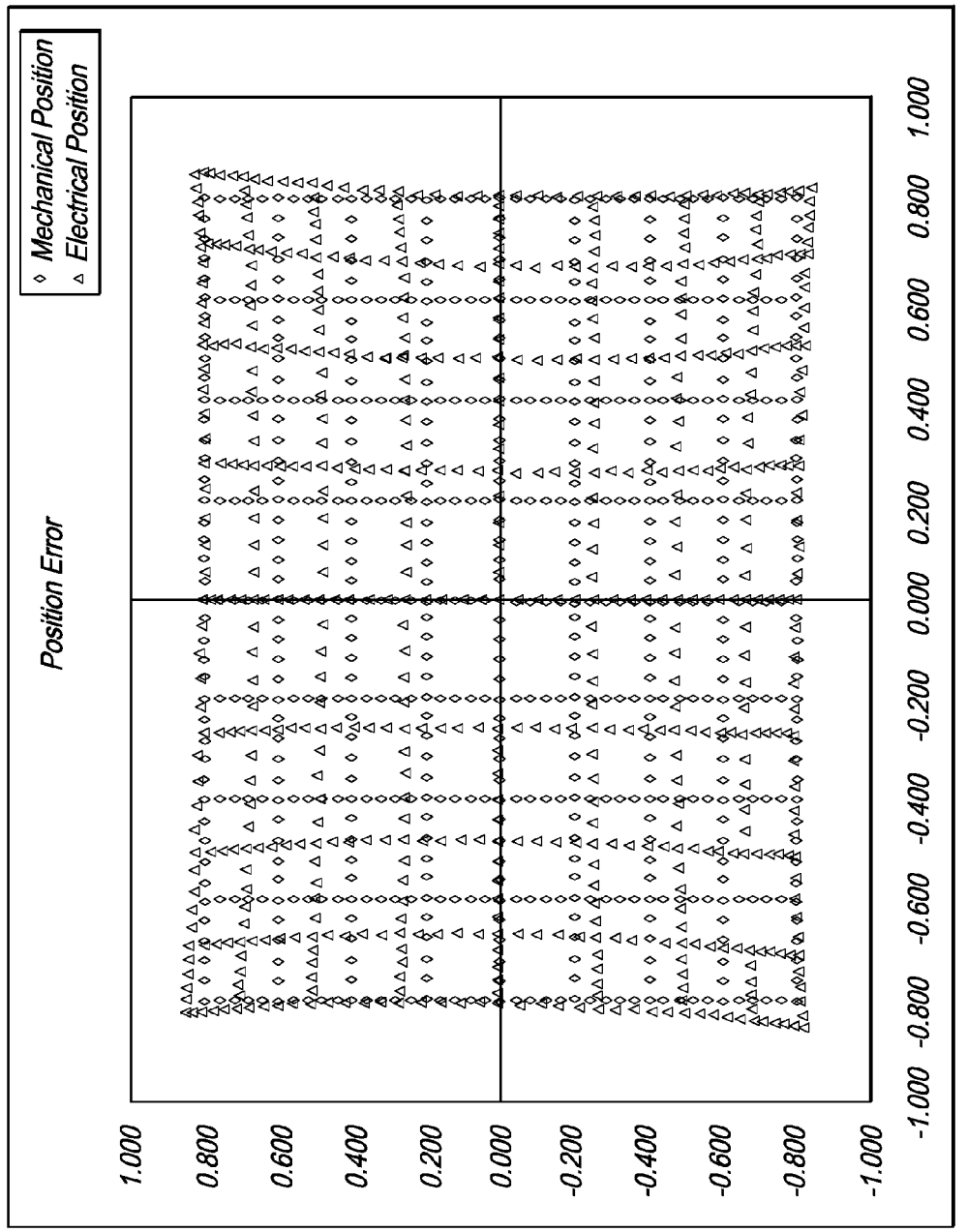
FIG. 8 illustrates a plot of a plurality of test measurements of position sensing error obtained by using the PSD of the present invention.

FIG. 8 illustrates a plot of a plurality of test measurements of position sensing error obtained by using the PSD of the present invention. In one embodiment, test measurements are taken as a laser beam is scanned across the active area of the photodiode. Both the actual mechanical position of the laser spot and the measured electrical position are shown in FIG. 8. The position detection error represents the deviation of electrical position from the mechanical position.

The average position detection error obtained from the test measurement data represented in the plot 800 at a light wavelength of 1550 nm is 0.118 mm in the horizontal plane (X-axis) and 0.116 in the vertical plane (Y axis).

Conventionally, tetra-lateral PSD have been manufactured using silicon. The use of InGaAs/InP in the present invention, however, enables position detection at eye safe wavelengths, namely wavelengths in the ranging from 1.3-1.55 μm.

Since modifications can be made to the aforementioned constructions without departing from the scope of the invention, it is intended that the matter described be interpreted as illustrative rather than restrictive. For example, semiconductor materials other than InGaAs or InP including silicon and germanium may be used. Also, different doping agents other than those mentioned above may be used while still preserving the diode structure and hence staying within the scope and intent of the present invention. The invention, therefore, should not be restricted, except to the following claims and their equivalents.

We claim:

1. A position sensing detector comprising a photodiode having an active area and having a first corner, a second corner, a third corner, and a fourth corner, said photodiode comprising
   a. A semi insulating substrate layer;
   b. A buffered layer, wherein said buffered layer is formed directly atop the semi-insulating substrate layer;
   c. An absorption layer, wherein said absorption layer is formed directly atop the buffered layer;
   d. A cap layer, wherein said cap layer is formed directly atop the absorption layer;
   e. Four cathode electrodes electrically coupled to said buffered layer, wherein a first of said four cathode electrodes is positioned in the first corner, a second of said four cathode electrodes is positioned in the second corner, a third of said four cathode electrodes is positioned in the third corner, and a fourth of said four cathode electrodes is positioned in the fourth corner; and
   f. At least one anode electrode electrically coupled to a p-type region in said cap layer, wherein said detector is capable of detecting eye-safe wavelengths and wherein said p-type region is doped with an effective amount of metal such that a position detection error, in both the X and Y direction is on the order of 100 μm across the active area.

2. The position sensing detector of claim 1 wherein said buffered layer comprises InP and wherein said eye-safe wavelengths are from 1.3-1.55 μm.

3. The position sensing detector of claim 1 wherein said absorption layer comprises InGaAs.

4. The position sensing detector of claim 1 wherein said cap layer comprises InP.

5. The position sensing detector of claim 1 wherein a photo response non-uniformity is less than 1 micron across said active area.

6. The position sensing detector of claim 1 wherein the photodiode further comprises an anti-reflective layer positioned atop the cap layer.

7. The position sensing detector of claim 1 wherein said p-type region in said cap layer is formed by diffusing a region of said cap layer with a suitable dopant to create said p-type region.

8. The position sensing detector of claim 7 wherein said dopant is zinc.

9. A position sensing detector comprising a photodiode having an active area, said photodiode being defined by a first corner, a second corner, a third corner, and a fourth corner and comprising
   a. A semi insulating substrate layer;
   b. A buffered layer, wherein said buffered layer is formed directly atop the semi-insulating substrate layer;
   c. An absorption layer, wherein said absorption layer is formed directly atop the buffered layer;
   d. A cap layer with a p-type region, wherein said cap layer is formed directly atop the absorption layer, wherein a p-n junction is formed between said cap layer and said absorption layer;
   e. Four cathode electrodes electrically coupled to said buffered layer, wherein a first of said four cathode electrodes is positioned in the first corner, a second of said four cathode electrodes is positioned in the second corner, a third of said four cathode electrodes is positioned in the third corner, and a fourth of said four cathode electrodes is positioned in the fourth corner; and
   f. At least one anode electrode electrically coupled to said cap layer, wherein said p-type region is doped with an effective amount of metal such that a position detection error, in both the X and Y direction is on the order of 100 μm across the active area.

10. The position sensing detector of claim 9 wherein said buffered layer comprises at least one of InGaAs or InP.

11. The position sensing detector of claim 9 wherein said absorption layer comprises at least one of InGaAs or InP.

12. The position sensing detector of claim 9 wherein said cap layer comprises at least one of InGaAs or InP.

13. The position sensing detector of claim 9 wherein said p-n junction is formed by diffusing a region of said cap layer with a suitable dopant.

14. The position sensing detector of claim 9 wherein said p-n junction is formed by diffusing a region of said absorption layer with a suitable dopant.

* * * * *